US009837577B2

(12) United States Patent
Kim et al.

(10) Patent No.: US 9,837,577 B2
(45) Date of Patent: Dec. 5, 2017

(54) LIGHT EMITTING DEVICE

(71) Applicant: LG INNOTEK CO., LTD., Seoul (KR)

(72) Inventors: Sung Kyoon Kim, Seoul (KR); Young Bong Yoo, Seoul (KR); Sung Ho Choo, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 86 days.

(21) Appl. No.: 14/140,765

(22) Filed: Dec. 26, 2013

(65) Prior Publication Data

US 2014/0183573 A1 Jul. 3, 2014

(30) Foreign Application Priority Data

Dec. 27, 2012 (KR) .......................... 10-2012-0154193

(51) Int. Cl.
*H01L 33/08* (2010.01)
*H01L 27/15* (2006.01)
*H01L 25/075* (2006.01)
*H01L 33/38* (2010.01)
*H01L 33/62* (2010.01)

(52) U.S. Cl.
CPC ............ *H01L 33/08* (2013.01); *H01L 27/156* (2013.01); *H01L 25/0753* (2013.01); *H01L 33/38* (2013.01); *H01L 33/62* (2013.01); *H01L 2924/0002* (2013.01)

(58) Field of Classification Search
CPC ......... H01L 27/156; H01L 2924/12041; H01L 25/167; H01L 33/08
See application file for complete search history.

(56) References Cited

U.S. PATENT DOCUMENTS

| | | | |
|---|---|---|---|
| 2007/0284598 A1* | 12/2007 | Shakuda | H01L 27/156 257/93 |
| 2008/0179602 A1* | 7/2008 | Negley | H01L 27/156 257/88 |
| 2008/0230789 A1* | 9/2008 | Onushkin | H01L 27/156 257/88 |
| 2011/0089442 A1* | 4/2011 | Jing | H01L 25/0753 257/91 |
| 2011/0211348 A1 | 9/2011 | Kim | |

(Continued)

FOREIGN PATENT DOCUMENTS

| | | |
|---|---|---|
| EP | 2 362 420 A1 | 8/2011 |
| WO | WO 2008/040315 A2 | 4/2008 |
| WO | WO 2008/111693 A1 | 9/2008 |

OTHER PUBLICATIONS

European Search Report issued in Application No. 13199281.0 dated Nov. 30, 2015.

*Primary Examiner* — Peniel M Gumedzoe
(74) *Attorney, Agent, or Firm* — Ked & Associates, LLP

(57) ABSTRACT

A light emitting device includes a substrate, a plurality of light emitting cells disposed on the substrate to be spaced apart from each other, and a connection wire electrically connecting adjacent ones of the light emitting cells. A first separation distance between first adjacent light emitting cells that are not connected by the connection wire among the light emitting cells is smaller than a second separation distance between second adjacent light emitting cells connected by the connection wire among the light emitting cells.

20 Claims, 8 Drawing Sheets

(56) References Cited

U.S. PATENT DOCUMENTS

2012/0187424 A1* 7/2012 Kim ............... H01L 27/156
                                              257/88
2013/0056785 A1* 3/2013 Hwang ............ H01L 27/15
                                              257/99

* cited by examiner

LIGHT EMITTING DEVICE

CROSS REFERENCE TO RELATED APPLICATION

This application claims priority under 35 U.S.C. §119 to Korean Patent Application No. 10-2012-0154193, filed in Korea on 27 Dec. 2012, which is hereby incorporated in its entirety by reference as if fully set forth herein.

BACKGROUND

1. Field

Embodiments relate to a light emitting device.

2. Background

Based on the development of metal organic chemical vapor deposition, molecular beam epitaxy, and the like of gallium nitride (GaN), red, green and blue light emitting diodes (LEDs) that have high luminance and realize white light have been developed.

Such LEDs do not contain environmentally harmful materials such as mercury (Hg), which is used in existing luminaires, such as incandescent lamps and fluorescent lamps and thus exhibit excellent eco-friendliness, long lifespan, and low power consumption and thus are replacing conventional light sources. A core competitive factor in such LEDs is to achieve high luminance using chips with high efficiency and high power output and packaging techniques.

To realize high luminance, it is important to increase light extraction efficiency. To increase light extraction efficiency, research into various methods using flip-chip structures, surface texturing, patterned sapphire substrates (PSSs), a photonic crystal technology, anti-reflection layer structures, and the like is underway.

FIG. 1 is a plan view of an existing light emitting device 10.

The light emitting device 10 illustrated in FIG. 1 includes first and second electrode pads 22 and 24, nine light emitting regions 40, and connection metals 30 electrically connecting adjacent ones of the nine light emitting regions 40. In this regard, distances D1, D2, D3 and D4 between the adjacent ones of the nine light emitting regions 40 are identical. Research into various methods of increasing luminous efficacy of the light emitting device 10 having such a general structure is underway.

The above references are incorporated by reference herein where appropriate for appropriate teachings of additional or alternative details, features and/or technical background.

BRIEF DESCRIPTION OF THE DRAWINGS

The embodiments will be described in detail with reference to the following drawings in which like reference numerals refer to like elements wherein.

DESCRIPTION OF SPECIFIC EMBODIMENTS

Hereinafter, embodiments will be described in detail with reference to the annexed drawings. However, the disclosure may be embodied in many different forms and should not be construed as being limited to embodiments set forth herein. Rather, these embodiments are provided so that this disclosure will be thorough and complete, and will fully convey the scope of the disclosure to those skilled in the art.

It will be understood that when an element is referred to as being "on" or "under" another element, it can be directly on/under the element, and one or more intervening elements may also be present.

When an element is referred to as being "on" or "under", "under the element" as well as "on the element" can be included based on the element.

Figure 2:
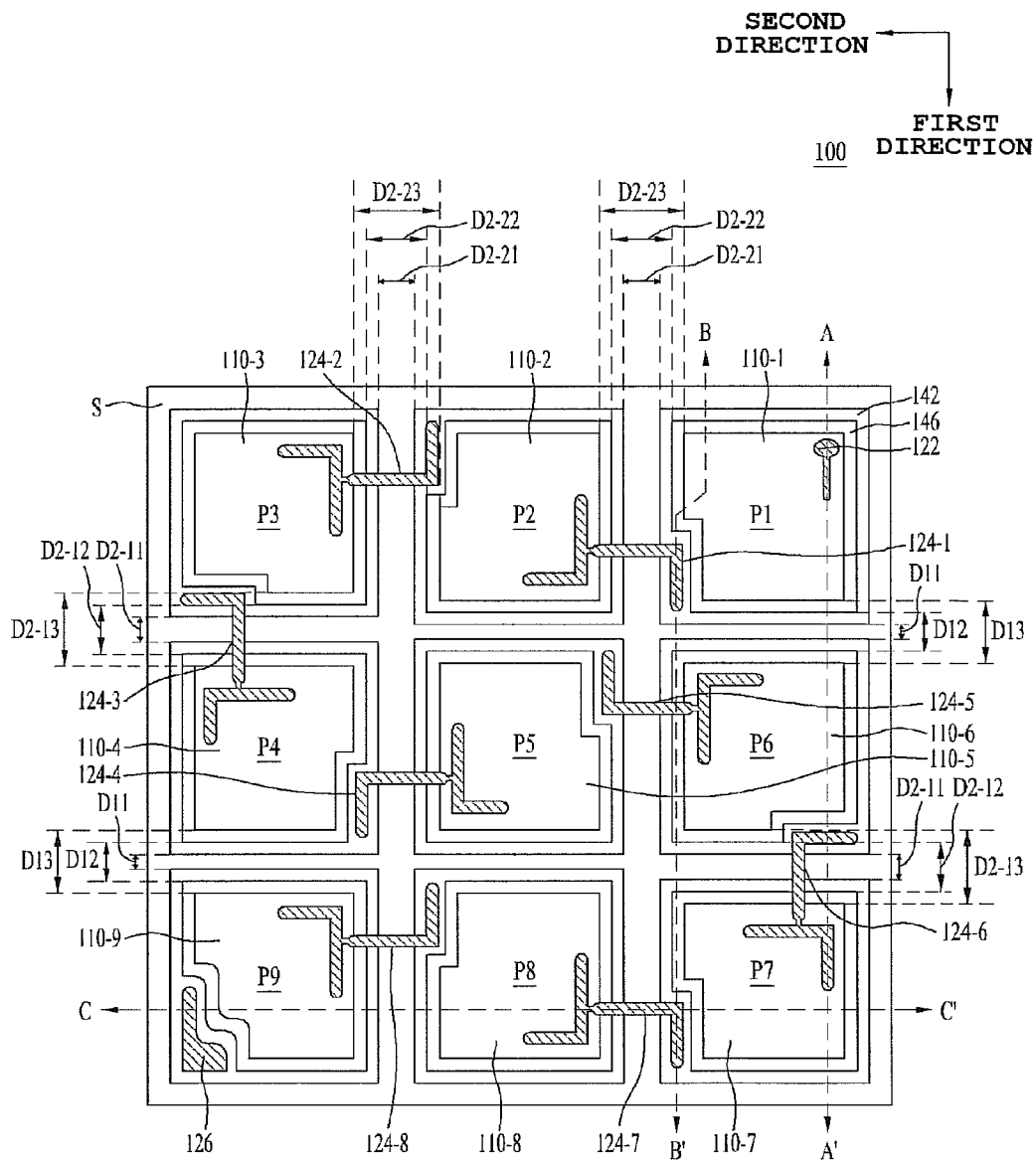
FIG. 2 is a plan view of a light emitting device according to an embodiment.
Figure 3:
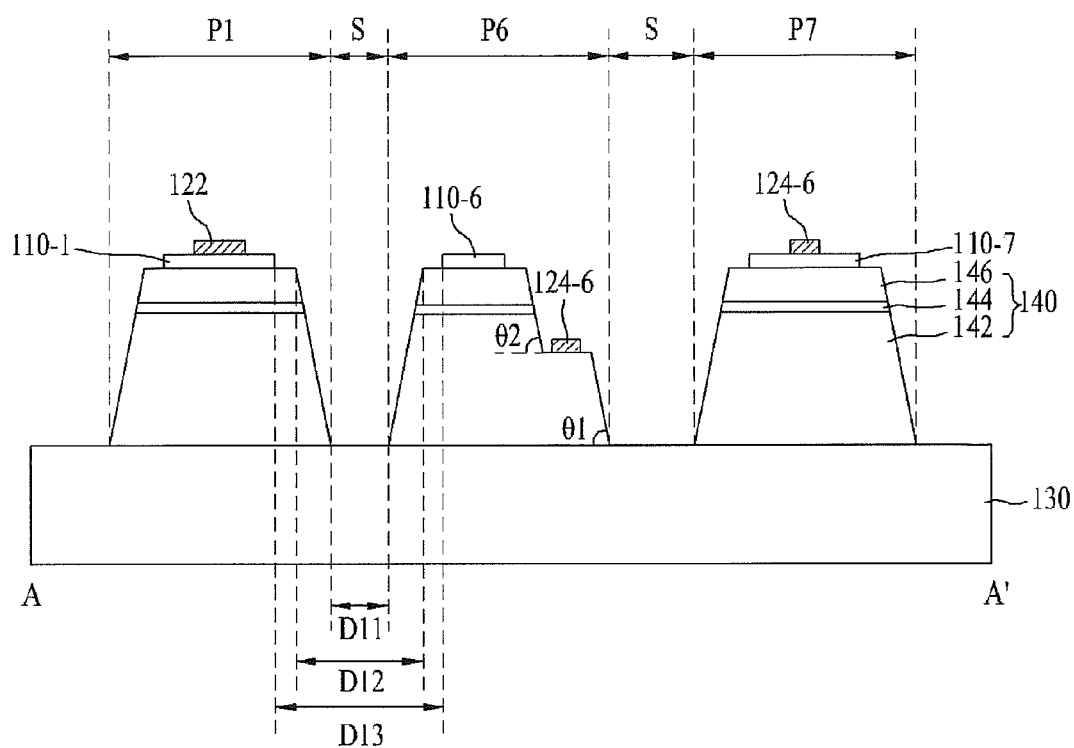
FIG. 3 is a sectional view taken along line A-A' of FIG. 2.
Figure 4:
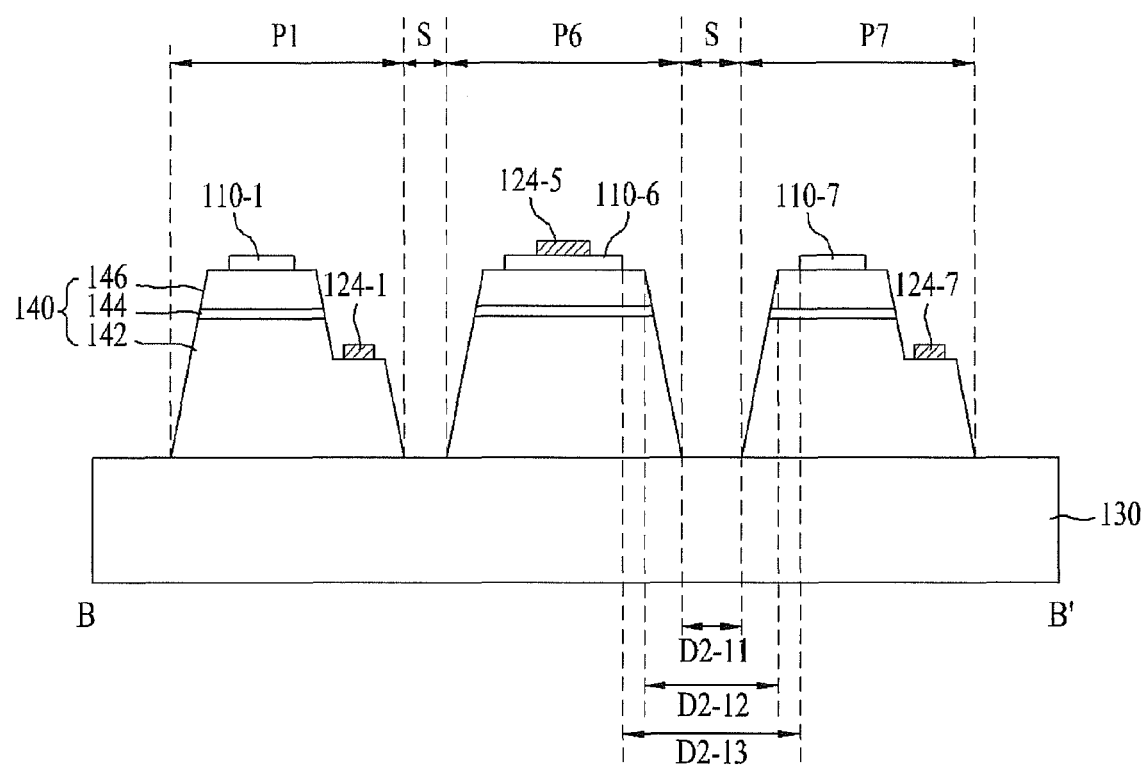
FIG. 4 is a sectional view taken along line B-B' of FIG. 2.
Figure 5:
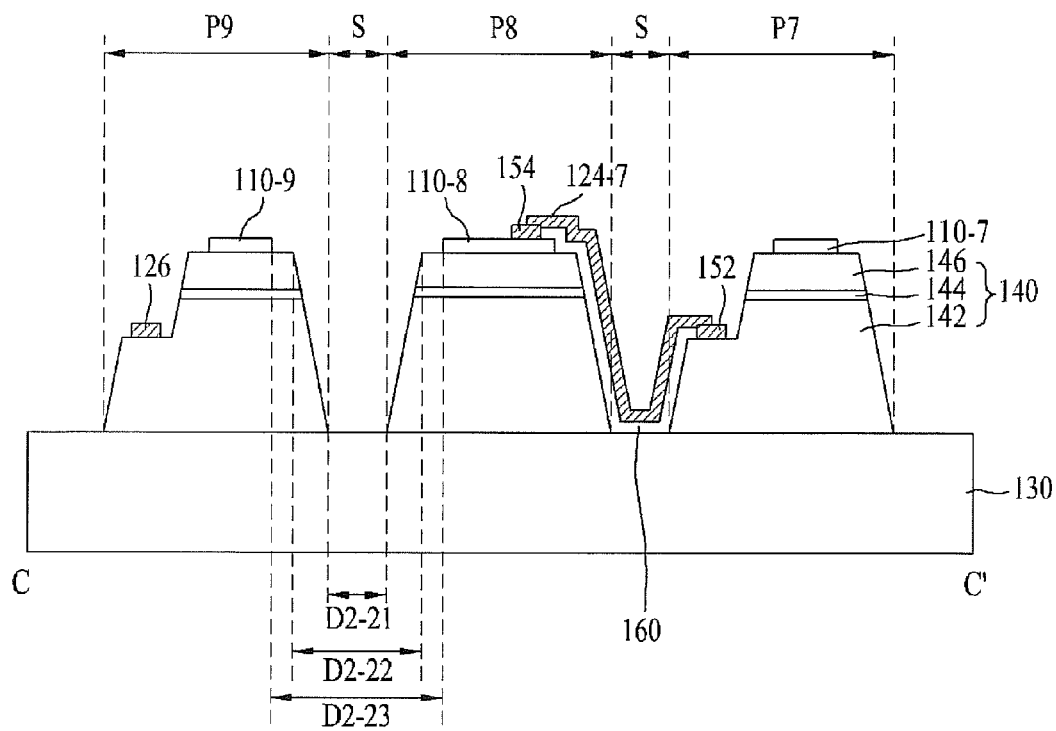
FIG. 5 is a sectional view taken along line C-C' of FIG. 2.

FIG. 2 is a plan view of a light emitting device 100 according to an embodiment. FIG. 3 is a sectional view taken along line A-A' of FIG. 2. FIG. 4 is a sectional view taken along line B-B' of FIG. 2. FIG. 5 is a sectional view taken along line C-C' of FIG. 2.

Referring to FIGS. 2 to 5, the light emitting device 100 includes first to $M^{th}$ conductive layers 110-1 to 110-M (wherein, M is a positive integer of 3 or greater), a first bonding pad 122, first to $N^{th}$ connection wires 124-1 to 124-N (wherein, N is a positive integer of 2 or greater), a second bonding pad 126, a substrate 130, and light emitting structures 140.

The substrate 130 may be formed of a material suitable for growth of semiconductor materials, e.g., a carrier wafer. In addition, the substrate 130 may be formed of a material with excellent thermal conductivity and may be a conductive substrate or an insulating substrate. In addition, the substrate 130 may be formed of an optically transmissive material and may have sufficient mechanical strength not to cause bending of the total nitride light emitting structures 140 of the light emitting device 100 and to satisfactorily separate into chips through scribing and breaking. For example, the substrate 130 may be made of at least one material selected from among sapphire ($Al_2O_3$), GaN, SiC, ZnO, Si, GaP, InP, $Ga_2O_3$, GaAs, and Ge. The substrate 130 may be provided at an upper surface thereof with an uneven patterned portion. For example, although not shown, the substrate 130 may be a patterned sapphire substrate (PSS).

In addition, although not shown, a buffer layer may be disposed between the substrate 130 and the light emitting structures 140. The buffer layer may be formed using a Group III-V compound semiconductor. The buffer layer reduces a difference in lattice constant between the substrate 130 and the light emitting structures 140. For example, the buffer layer may include AlN or an undoped nitride, but embodiments are not limited thereto. The buffer layer may be omitted according to type of the substrate 130 and types of the light emitting structures 140.

Hereinafter, a case in which the number of light emitting cells (or light emitting regions) is 9 will be described by way of example for convenience of explanation, but embodiments are not limited thereto. That is, the number of light emitting cells may be greater than 9 or less than 9.

The light emitting cells are disposed on the substrate 130 to be spaced apart from each other in a horizontal direction.

First, a plurality of light emitting regions P1 to PM is referred to, in ascending order, as first to $M^{th}$ light emitting regions. That is, a light emitting region in which the first bonding pad 122 is disposed is referred to as a first light emitting region P1, and a light emitting region in which the second bonding pad 126 is disposed is referred to as a ninth light emitting region.

First to $M^{th}$ light emitting cells are respectively disposed in the first to $M^{th}$ light emitting regions of the substrate 130. That is, the first light emitting cell is disposed in the first light emitting region P1 of the substrate 130, the second light emitting cell is disposed in the second light emitting region P2 of the substrate 130, the third light emitting cell is disposed in the third light emitting region P3 of the substrate 130, the fourth light emitting cell is disposed in the fourth light emitting region P4 of the substrate 130, the fifth light emitting cell is disposed in the fifth light emitting region P5 of the substrate 130, the sixth light emitting cell is disposed in the sixth light emitting region P6 of the substrate 130, the seventh light emitting cell is disposed in the seventh light emitting region P7 of the substrate 130, the eighth light emitting cell is disposed in the eighth light emitting region P8 of the substrate 130, and the ninth light emitting cell is disposed in the ninth light emitting region P9 of the substrate 130. As such, an $M^{th}$ light emitting cell is disposed in an $M^{th}$ light emitting region Pm of the substrate 130 where $1 \leq m \leq M$. Hereinafter, the $m^{th}$ light emitting cell is represented as 'Pm' for convenience of explanation.

Each of the first to $M^{th}$ light emitting cells P1 to PM includes the light emitting structure 140, an $m^{th}$ conductive layer 110-$m$, and first and second electrodes that are disposed on the substrate 130. The light emitting structure 140 constituting one light emitting cell may be separated from the light emitting structure 140 of another light emitting cell by a boundary region S. The boundary region S may be a region located in a boundary of each of the first to $M^{th}$ light emitting cells P1 to PM, e.g., the substrate 130. The first to $M^{th}$ light emitting cells P1 to PM may have the same area, but embodiments are not limited thereto. For example, according to another embodiment, the first to $M^{th}$ light emitting cells P1 to PM may have different areas. According to another embodiment, a portion of the first to $M^{th}$ light emitting cells P1 to PM may have the same area and another portion of the first to $M^{th}$ light emitting cells P1 to PM may have different areas.

The light emitting structure 140 of each of the first to $M^{th}$ light emitting cells P1 to PM includes a first conductive type semiconductor layer 142, an active layer 144, and a second conductive type semiconductor layer 146 that are sequentially disposed on the substrate 130.

The first conductive type semiconductor layer 142 may be disposed between the substrate 130 and the active layer 144, include a semiconductor compound, for example, a Group III-V or II-VI compound semiconductor, and be doped with a first conductive type dopant. For example, the first conductive type semiconductor layer 142 may include at least one of a semiconductor material having the formula of $Al_xIn_yGa_{(1-x-y)}N$, wherein $0 \leq x \leq 1$, $0 \leq y \leq 1$, and $0 \leq x+y \leq 1$, InAlGaN, AlGaAs, GaP, GaAs, GaAsP, or AlGaInP. When the first conductive type semiconductor layer 142 is of an n-type, the first conductive type dopant may include an n-type dopant such as Si, Ge, Sn, Se, Te, or the like. The first conductive type semiconductor layer 142 may have a single layer structure or a multilayer structure, but embodiments are not limited thereto.

The active layer 144 is disposed between the first conductive type semiconductor layer 142 and the second conductive type semiconductor layer 146 and may include any one of a single well structure, a multi-well structure, a single quantum well structure, a multi quantum well (MQW) structure, a quantum dot structure, and a quantum wire structure. The active layer 144 may include a Group III-V compound semiconductor and have at least one pair structure of a well layer/a barrier layer, e.g., of InGaN/GaN, InGaN/InGaN, GaN/AlGaN, InAlGaN/GaN, GaAs(InGaAs)/AlGaAs, or GaP(InGaP)/AlGaP, but embodiments are not limited thereto. The well layer may be formed of a material having a lower energy band gap than that of the barrier layer.

The second conductive type semiconductor layer 146 is disposed on the active layer 144 and may include a semiconductor compound. The second conductive type semiconductor layer 146 may be formed of a Group III-V semiconductor compound, a Group II-VI semiconductor compound, or the like. For example, the second conductive type semiconductor layer 146 may include at least one of a semiconductor material having the formula of $In_xAl_yGa_{1-x-y}N$ where $0 \leq x \leq 1$, $0 \leq y \leq 1$, and $0 \leq x+y \leq 1$, AlInN, AlGaAs, GaP, GaAs, GaAsP, or AlGaInP.

The second conductive type semiconductor layer 146 may be of a second conductive type. When the second conductive type semiconductor layer 146 is of a p-type, the second conductive type dopant may be a p-type dopant such as Mg, Zn, Ca, Sr, Ba, or the like. The second conductive type semiconductor layer 146 may have a single layer or multi-layer structure, but embodiments are not limited thereto.

The first conductive type semiconductor layer 142 may be of an n-type and the second conductive type semiconductor layer 146 may be of a p-type. In another embodiment, the first conductive type semiconductor layer 142 may be of a p-type and the second conductive type semiconductor layer 146 may be of an n-type. Accordingly, the light emitting structure 140 may include at least one of an n-p junction structure, a p-n junction structure, an n-p-n junction structure, or a p-n-p junction structure.

Hereinafter, a case in which the first conductive type semiconductor layer 142 is of an n-type and the second conductive type semiconductor layer 146 is of a p-type will be described by way of example, but embodiments are not limited thereto. That is, the present embodiment may also be applied to a case in which the first conductive type semiconductor layer 142 is of a p-type and the second conductive type semiconductor layer 146 is of an n-type.

In each of the first to $M^{th}$ light emitting cells P1 to PM, the first electrode 152 is disposed on the first conductive type semiconductor layer 142. For example, referring to FIG. 5, the first electrode 152 of the seventh light emitting cell P7 is disposed on the first conductive type semiconductor layer 142. To dispose the first electrode on the first conductive type semiconductor layer 142, the first conductive type semiconductor layer 142 of the light emitting structure 140 may be partially exposed. That is, the second conductive type semiconductor layer 146, the active layer 144, and the first conductive type semiconductor layer 142 may be partially etched by mesa etching to expose a portion of the first conductive type semiconductor layer 142. In this regard, an exposed surface of the first conductive type semiconductor layer 142 may be disposed lower than a lower surface of the active layer 144.

In another embodiment, instead of separately disposing the first electrode of each of the first to $M^{th}$ light emitting cells P1 to PM on the first conductive type semiconductor layer 142, the first electrode of an $i^{th}$ light emitting cell Pi where $1 \leq i \leq M-1$ may be integrally formed with an $i^{th}$ connection wire 124-*i*. For example, referring to FIG. 4, the first electrode of the first light emitting cell P1 is integrally formed with the first connection wire 124-1. In another embodiment, however, as illustrated in FIG. 5, the first electrode of the $M^{th}$ light emitting cell (e.g., the ninth light emitting cell P9) may be integrally formed with the second bonding pad 126, instead of with the connection wire, but embodiments are not limited thereto. That is, the first electrode of the $M^{th}$ light emitting cell PM may be separately formed from the second bonding pad 126.

In each of the first to $M^{th}$ light emitting cells P1 to PM, the second electrode is disposed on the second conductive type semiconductor layer 146. For example, referring to FIG. 5, the second electrode 154 of the eighth light emitting cell P8 is disposed on the second conductive type semiconductor layer 146.

In another embodiment, instead of separately disposing the second electrode of each of the first to $M^{th}$ light emitting cells P1 to PM on the second conductive type semiconductor layer 146, the second electrode of a $j^{th}$ light emitting cell Pj where $2 \leq j \leq M$ may be integrally formed with a j−1 connection wire 124-(*j*−1). For example, referring to FIG. 4, the second electrode of the $6^{th}$ light emitting cell P6 may be integrally formed with the fifth connection wire 124-5. In another embodiment, however, as illustrated in FIG. 3, the second electrode of the first light emitting cell P1 may be integrally formed with the first bonding pad 122, instead of with a connection wire, but embodiments are not limited thereto. That is, the second electrode of the first light emitting cell P1 may be separately formed from the first bonding pad 122.

Each of the first and second electrodes of each of the first to $M^{th}$ light emitting cells P1 to PM may have a structure in which an adhesive layer (not shown), a barrier layer (not shown), and a bonding layer (not shown) are sequentially stacked. The adhesive layer of the first electrode may include a material in ohmic contact with the first conductive type semiconductor layer 142, and the adhesive layer of the second electrode 154 may include a material in ohmic contact with the second conductive type semiconductor layer 146. For example, the adhesive layer may be formed as a single layer or multiple layers using at least one of Cr, Rd, or Ti.

The barrier layer is disposed on the adhesive layer and may be formed as a single layer or multiple layers using at least one of Ni, Cr, Ti, or Pt. For example, the barrier layer may be formed of a Cr—Pt alloy.

In addition, a reflection layer formed of Ag or the like may be disposed between the barrier layer and the adhesive layer, but may be omitted. The bonding layer is disposed on the barrier layer and may include Au.

The first bonding pad 122 may be bonded with a wire (not shown) for supplying a first power. Referring to FIGS. 2 and 3, the first bonding pad 122 may be disposed on the second conductive type semiconductor layer 146 of any one (e.g., the first light emitting cell P1) of the first to $M^{th}$ light emitting cells P1 to PM and contact the second conductive type semiconductor layer 146.

In addition, the second bonding pad 126 may be bonded with a wire (not shown) for supplying a second power. Referring to FIGS. 2 and 5, the second bonding pad 126 may be disposed on the first conductive type semiconductor layer 142 of another (e.g., the ninth light emitting cell P9) of the first to $M^{th}$ light emitting cells P1 to PM and contact the first conductive type semiconductor layer 142.

Each of the conductive layers 110-1 to 110-M may be disposed between the second electrode and the second conductive type semiconductor layer 146. Each 110-*m* of the conductive layers 110-1 to 110-M reduces total reflection and is highly optically transmissive and thus may increase extraction efficiency of light having been emitted from the active layer 144 and passed through the second conductive type semiconductor layer 146. Each conductive layer 110-*m* may be formed as a single layer or multiple layers using at least one of oxide-based materials that have high transmittance with respect to luminescence wavelengths and are transparent, e.g., indium tin oxide (ITO), tin oxide (TO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), aluminum tin oxide (ATO), gallium zinc oxide (GZO), $IrO_x$, $RuO_x$, $RuO_x$/ITO, Ni, Ag, Ni/$IrO_x$/Au, or Ni/$IrO_x$/Au/ITO.

An area of each conductive layer 110-*m* disposed on the second conductive type semiconductor layer 146 may be equal to or less than an area of an upper surface of the second conductive type semiconductor layer 146.

Meanwhile, the first to $N^{th}$ connection wires 124-1 to 124-N serve to connect the first to $M^{th}$ light emitting cells P1 to PM to each other. That is, each of the first to $N^{th}$ connection wires 124-1 to 124-N electrically connects adjacent ones of the first to $M^{th}$ light emitting cells P1 to PM. That is, the $i^{th}$ connection wire 124-*i* where $1 \leq i \leq M-1$ is disposed on the $i^{th}$ light emitting region Pi, an $i+1^{th}$ light emitting region P(i+1), and a boundary region S therebetween to electrically connect the $i^{th}$ light emitting region Pi and the $i+1^{th}$ light emitting region P(i+1) that adjoin each other. For example, the first connection wire 124-1 (wherein i=1) electrically connects the first light emitting cell P1 and the second light emitting cell P2 that are adjacent to each other and, as illustrated in FIG. 5, the seventh connection wire 124-7 is disposed on the seventh light emitting region P7, the eighth light emitting region P8, and a boundary region S therebetween to electrically connect the seventh light emitting region P7 and the eighth light emitting region P8.

As illustrated in FIGS. 2 to 5, the first to $M^{th}$ light emitting cells P1 to PM are electrically connected to each other in series by the first to $N^{th}$ connection wires 124-1 to 124-N. In this case, N=M−1. The first to $N^{th}$ connection wires 124-1 to 124-N may connect the first to $M^{th}$ light emitting cells P1 to PM in series, starting from the first light emitting cell P1 in which the first bonding pad 122 is disposed and ending at the $M^{th}$ light emitting cell PM in which the second bonding pad 126 is disposed, but embodiments are not limited thereto. That is, at least a portion of the first to $M^{th}$ light emitting cells P1 to PM may be electrically connected to each other in parallel by a connection wire.

Each of the first to $N^{th}$ connection wires 124-1 to 124-N may be formed of the same or different materials as that of each of the first and second electrodes. When the first to $N^{th}$ connection wires 124-1 to 124-N are formed of the same material as that of the first and second electrodes, as described above, the connection wire may be integrally formed with the first or second electrode. Each of the first to $N^{th}$ connection wires 124-1 to 124-N may include at least one of Cr, Rd, Au, Ni, Ti, or Pt, but embodiments are not limited thereto.

Meanwhile, an insulating layer 160 is disposed between each of the first to $N^{th}$ connection wires 124-1 to 124-N and adjacent light emitting cells connected by the corresponding connection wire to electrically separate the connection wire from the adjacent light emitting cells. That is, the insulating layer 160 is disposed between the $i^{th}$ connection wire 124-*i* and adjacent i$^{th}$ and i+1$^{th}$ light emitting cells Pi and P(i+1) connected by the i$^{th}$ connection wire 124-*i* to electrically separate the i$^{th}$ connection wire 124-*i* from the i$^{th}$ light emitting cell Pi and electrically separate the i$^{th}$ connection wire 124-*i* from the i+1$^{th}$ light emitting cell P(i+1). For example, referring to FIG. 5, the insulating layer 160 is disposed between the seventh connection wire 124-7 and adjacent seventh and eighth light emitting cells P7 and P8 to electrically separate the seventh connection wire 124-7 from each of the seventh and eighth light emitting cells P7 and P8, but embodiments are not limited thereto. That is, according to another embodiment, the insulating layer 160 may be further disposed on the first to M$^{th}$ light emitting cells P1 to PM and the boundary regions S. That is, the insulating layer 160 may cover upper and side surfaces of the first to M$^{th}$ light emitting cells P1 to PM and the boundary regions S. The insulating layer 160 may be formed of an optically transmissive and insulating material, e.g., $SiO_2$, $SiO_x$, $SiO_xN_y$, $Si_3N_4$, or $Al_2O_3$.

Figure 6:
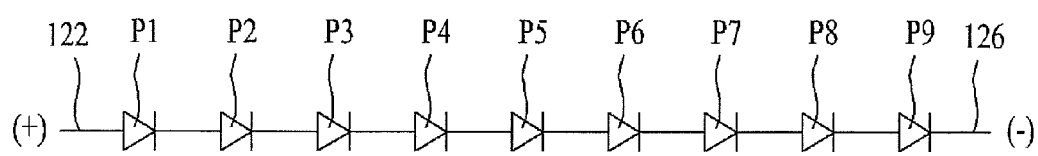
FIG. 6 is a circuit diagram of the light emitting device of FIG. 2.

FIG. 6 is a circuit diagram of the light emitting device 100 of FIG. 2.

Referring to FIGS. 2 and 6, the light emitting device 100 may have a common single positive (+) terminal, e.g., the first bonding pad 122, and a common single negative (−) terminal, e.g., the second bonding pad 126.

Figure 1:
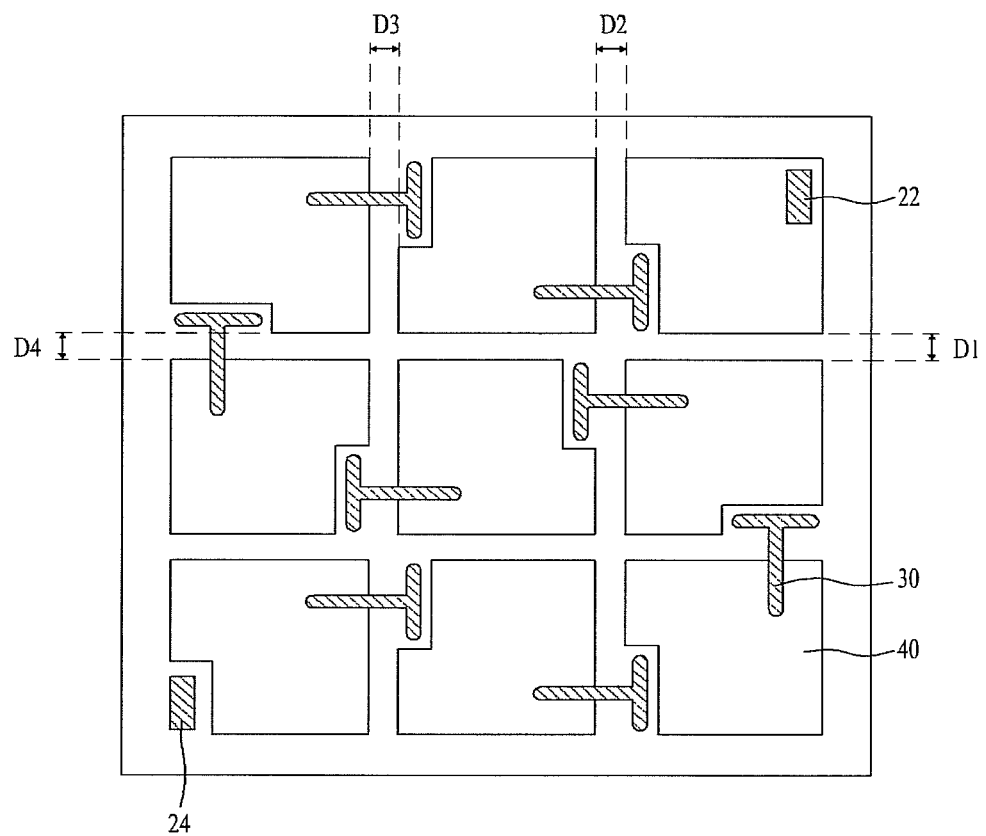
FIG. 1 is a plan view of an existing light emitting device.

Meanwhile, in the conventional light emitting device 10 of FIG. 1, separation distances D1, D2, D3 and D4 between the light emitting regions 40 are identical. By contrast, according to embodiments of the disclosure, in the first to M$^{th}$ light emitting cells P1 to PM, a separation distance (hereinafter, referred to as a "first separation distance") between light emitting cells adjacent to each other without being connected by any one of the first to N$^{th}$ connection wires 124-1 to 124-N (hereinafter, referred to as a "first adjacent light emitting cells") is smaller than a separation distance (hereinafter, referred to as a "second separation distance") between light emitting cells adjacent to each other with being connected by the corresponding connection wire (hereinafter, referred to as a "second adjacent light emitting cells").

That is, referring to FIG. 2, the first and sixth light emitting cells P1 and P6, the second and fifth light emitting cells P2 and P5, the fourth and ninth light emitting cells P4 and P9, and the fifth and eighth light emitting cells P5 and P8 correspond to the first adjacent light emitting cells that are not connected to each other by any connection wire. In addition, the first and second light emitting cells P1 and P2, the second and third light emitting cells P2 and P3, the third and fourth light emitting cells P3 and P4, the fourth and fifth light emitting cells P4 and P5, the fifth and sixth light emitting cells P5 and P6, the sixth and seventh light emitting cells P6 and P7, the seventh and eighth light emitting cells P7 and P8, and the eighth and ninth light emitting cells P8 and P9 correspond to the second adjacent light emitting cells that are connected to each other by the corresponding connection wire.

The first adjacent light emitting cells may adjoin each other in a first direction, and the second adjacent light emitting cells may adjoin each other in the first direction or a second direction. Hereinafter, the second adjacent light emitting cells adjoining each other in the first direction are referred to as "2-1 adjacent light emitting cells," and the second adjacent light emitting cells adjoining each other in the second direction are referred to as "2-2 adjacent light emitting cells." The first direction is different from the second direction. For example, the first direction may be perpendicular to the second direction, the first direction may be a vertical direction, and the second direction may be a horizontal direction, but embodiments are not limited thereto.

Referring to FIG. 2, the third and fourth light emitting cells P3 and P4 correspond to the 2-1 adjacent light emitting cells, and the sixth and seventh light emitting cells P6 and P7 also correspond to the 2-1 adjacent light emitting cells. In addition, the first and second light emitting cells P1 and P2, the second and third light emitting cells P2 and P3, the fourth and fifth light emitting cells P4 and P5, the fifth and sixth light emitting cells P5 and P6, the seventh and eighth light emitting cells P7 and P8, and the eighth and ninth light emitting cells P8 and P9 correspond to the 2-2 adjacent light emitting cells.

Hereinafter, a separation distance between the 2-1 adjacent light emitting cells is referred to as a "2-1 separation distance," and a separation distance between the 2-2 adjacent light emitting cells is referred to as a "2-2 separation distance."

According to one embodiment, the first separation distance may be smaller than the 2-1 separation distance and the 2-2 separation distance. In this regard, the 2-1 separation distance and the 2-2 separation distance may be the same or different. For example, the 2-1 separation distance may be smaller than the 2-2 separation distance.

According to another embodiment, the first separation distance may be smaller than the 2-1 separation distance and the same as the 2-2 separation distance. As such, the 2-1 separation distance and the 2-2 separation distance may be different.

According to another embodiment, the first separation distance may be smaller than the 2-2 separation distance and the same as the 2-1 separation distance. As such, the 2-1 separation distance and the 2-2 separation distance may be different.

Meanwhile, a side surface of the light emitting structure 140 may be inclined with respect to the substrate 130. That is, as illustrated in FIG. 3, a side surface of the first conductive type semiconductor layer 142 may be inclined at an angle $\theta_1$ with respect to the substrate 130, and a side surface of the first conductive type semiconductor layer 142, adjacent to an exposed upper portion thereof, may be inclined at an angle $\theta_2$. As such, the side surface of the light emitting structure 140 is inclined to prevent disconnection of each connection wire electrically connecting the adjacent light emitting cells. For example, when the side surface of the light emitting structure 140 is at a right angle (i.e., $\theta_1=90°$, not in an inclined form, the connection wire 124-7 disposed on the boundary region S may be disconnected. For this configuration, the angles $\theta_1$ and $\theta_2$ may be between 30° and 80°.

The first separation distance, the 2-1 separation distance, and the 2-2 separation distance in a case in which the side surface of the light emitting structure 140 is inclined will now be described in detail with reference to FIGS. 2 to 5.

According to one embodiment, the first separation distance may correspond to a separation distance between the first conductive type semiconductor layers 142 of the first adjacent light emitting cells. That is, a separation distance D11 between the first conductive type semiconductor layers 142 of the first and sixth light emitting cells P1 and P6 may correspond to the first separation distance, the separation distance D11 between the first conductive type semiconductor layers 142 of the second and fifth light emitting cells P2 and P5 may correspond to the first separation distance, the separation distance D11 between the first conductive type semiconductor layers 142 of the fourth and ninth light emitting cells P4 and P9 may correspond to the first separation distance, and the separation distance D11 between the first conductive type semiconductor layers 142 of the fifth and eighth light emitting cells P5 and P8 may correspond to the first separation distance.

In this regard, the second separation distance may correspond to a separation distance between the first conductive type semiconductor layers 142 of the second adjacent light emitting cells. First, in case that the second adjacent light emitting cells correspond to the 2-1 adjacent light emitting cells separated from each other in the first direction, a separation distance D2-11 between the first conductive type semiconductor layers 142 of the third and fourth light emitting cells P3 and P4 may correspond to the second separation distance, and the separation distance D2-11 between the first conductive type semiconductor layers 142 of the sixth and seventh light emitting cells P6 and P7 may correspond to the second separation distance. In another embodiment, in case that the second adjacent light emitting cells correspond to the 2-2 adjacent light emitting cells separated from each other in the second direction, a separation distance D2-21 between the first conductive type semiconductor layers 142 of the first and second light emitting cells P1 and P2 may correspond to the second separation distance, the separation distance D2-21 between the first conductive type semiconductor layers 142 of the second and third light emitting cells P2 and P3 may correspond to the second separation distance, the separation distance D2-21 between the first conductive type semiconductor layers 142 of the fourth and fifth light emitting cells P4 and P5 may correspond to the second separation distance, the separation distance D2-21 between the first conductive type semiconductor layers 142 of the fifth and sixth light emitting cells P5 and P6 may correspond to the second separation distance, the separation distance D2-21 between the first conductive type semiconductor layers 142 of the seventh and eighth light emitting cells P7 and P8 may correspond to the second separation distance, and the separation distance D2-21 between the first conductive type semiconductor layers 142 of the eighth and ninth light emitting cells P8 and P9 may correspond to the second separation distance.

As shown in FIGS. 3, 4, and 5, each of the above separation distances D11, D2-11, and D2-21 may correspond to a distance between bottom surfaces of the first conductive type semiconductor layers 142, but embodiments are not limited thereto. According to another embodiment, each of the above separation distances D11, D2-11, and D2-21 may correspond to a distance between top surfaces of the first conductive type semiconductor layers 142.

According to another embodiment, the first separation distance may correspond to a separation distance between the second conductive type semiconductor layers of the first adjacent light emitting cells. That is, a separation distance D12 between the second conductive type semiconductor layers 146 of the first and sixth light emitting cells P1 and P6 may correspond to the first separation distance, the separation distance D12 between the second conductive type semiconductor layers 146 of the second and fifth light emitting cells P2 and P5 may correspond to the first separation distance, the separation distance D12 between the second conductive type semiconductor layers 146 of the fourth and ninth light emitting cells P4 and P9 may correspond to the first separation distance, and the separation distance D12 between the second conductive type semiconductor layers 146 of the fifth and eighth light emitting cells P5 and P8 may correspond to the first separation distance.

In this regard, the second separation distance may correspond to a separation distance between the second conductive type semiconductor layers 146 of the second adjacent light emitting cells. First, in case that the second adjacent light emitting cells correspond to the 2-1 adjacent light emitting cells separated from each other in the first direction, a separation distance D2-12 between the second conductive type semiconductor layers 146 of the third and fourth light emitting cells P3 and P4 may correspond to the second separation distance, and the separation distance D2-12 between the second conductive type semiconductor layers 146 of the sixth and seventh light emitting cells P6 and P7 may correspond to the second separation distance. In another embodiment, in case that the second adjacent light emitting cells correspond to the 2-2 adjacent light emitting cells separated from each other in the second direction, a separation distance D2-22 between the second conductive type semiconductor layers 146 of the first and second light emitting cells P1 and P2 may correspond to the second separation distance, the separation distance D2-22 between the second conductive type semiconductor layers 146 of the second and third light emitting cells P2 and P3 may correspond to the second separation distance, the separation distance D2-22 between the second conductive type semiconductor layers 146 of the fourth and fifth light emitting cells P4 and P5 may correspond to the second separation distance, the separation distance D2-22 between the second conductive type semiconductor layers 146 of the fifth and sixth light emitting cells P5 and P6 may correspond to the second separation distance, the separation distance D2-22 between the second conductive type semiconductor layers 146 of the seventh and eighth light emitting cells P7 and P8 may correspond to the second separation distance, and the separation distance D2-22 between the second conductive type semiconductor layers 146 of the eighth and ninth light emitting cells P8 and P9 may correspond to the second separation distance.

As shown in FIGS. 3, 4, and 5, each of the above separation distances D12, D2-12, and D2-22 may correspond to a distance between top surfaces of the second conductive type semiconductor layers 146, but embodiments are not limited thereto. According to another embodiment, each of the above separation distances D12, D2-12, and D2-22 may correspond to a distance between bottom surfaces of the second conductive type semiconductor layers 146.

According to another embodiment, the first separation distance may correspond to a separation distance between the conductive layers of the first adjacent light emitting cells. That is, a separation distance D13 between the conductive layers 110-1 and 110-6 of the respective first and sixth light emitting cells P1 and P6 may correspond to the first separation distance, the separation distance D13 between the conductive layers 110-2 and 110-5 of the respective second and fifth light emitting cells P2 and P5 may correspond to the first separation distance, the separation distance D13 between the conductive layers 110-4 and 110-9 of the respective fourth and ninth light emitting cells P4 and P9 may correspond to the first separation distance, and the separation distance D13 between the conductive layers 110-5 and 110-8 of the respective fifth and eighth light emitting cells P5 and P8 may correspond to the first separation distance.

In this regard, the second separation distance may correspond to a separation distance between the conductive layers of the second adjacent light emitting cells. First, in case that the second adjacent light emitting cells correspond to the 2-1 adjacent light emitting cells separated from each other in the first direction, a separation distance D2-13 between the conductive layers 110-3 and 110-4 of the respective third and fourth light emitting cells P3 and P4 may correspond to the second separation distance, and the separation distance D2-13 between the conductive layers 110-6 and 110-7 of the respective sixth and seventh light emitting cells P6 and P7 may correspond to the second separation distance. In another embodiment, in case that the second adjacent light emitting cells correspond to the 2-2 adjacent light emitting cells separated from each other in the second direction, a separation distance D2-23 between the conductive layers 110-1 and 110-2 of the respective first and second light emitting cells P1 and P2 may correspond to the second separation distance, the separation distance D2-23 between the conductive layers 110-2 and 110-3 of the respective second and third light emitting cells P2 and P3 may correspond to the second separation distance, the separation distance D2-23 between the conductive layers 110-4 and 110-5 of the respective fourth and fifth light emitting cells P4 and P5 may correspond to the second separation distance, the separation distance D2-23 between the conductive layers 110-5 and 110-6 of the respective fifth and sixth light emitting cells P5 and P6 may correspond to the second separation distance, the separation distance D2-23 between the conductive layers 110-7 and 110-8 of the respective seventh and eighth light emitting cells P7 and P8 may correspond to the second separation distance, and the separation distance D2-23 between the conductive layers 110-8 and 110-9 of the respective eighth and ninth light emitting cells P8 and P9 may correspond to the second separation distance.

According to an embodiment, the first separation distance is determined by considering a minimum distance between the first adjacent light emitting cells, which has to be maintained to prevent short circuit between the first adjacent light emitting cells. In addition, when the first separation distance is too great, an area of light emitting regions is insignificantly increased and thus luminous intensity enhancing effects and operating voltage increasing effects may be minimal. Therefore, the first separation distance may be 0.2 times or greater the second separation distance and less than the second separation distance. In addition, the second separation distance is set at a degree to which short circuit between the second adjacent light emitting cells is prevented and thus the second adjacent light emitting cells are stably connected to each other.

For example, when the separation distance D11 corresponds to the first separation distance and the separation distance D2-11 or D2-21 corresponds to the second separation distance, the first separation distance may be between 4 μm and 20 μm and the second separation distance may be greater than 20 μm. In another embodiment, when the separation distance D12 corresponds to the first separation distance and the separation distance D2-12 or D2-22 corresponds to the second separation distance, the first separation distance may be between 10 μm and 25 μm and the second separation distance may be greater than 25 μm.

If the side surface of the light emitting structure 140 is not inclined with respect to the substrate 130, the separation distances D2-21 and D2-22 may be identical, the separation distances D2-11 and D2-12 may be identical, and the separation distances D11 and D12 may be identical.

Hereinafter, improvements in luminous intensity Po and operating voltage Vf according to increase in unit area of each light emitting cell, assuming that the first to $M^{th}$ light emitting cells P1 to PM (wherein, M=21) of the light emitting device 100 of FIGS. 2 to 5 have the same area, will be described as follows.

Figure 7:
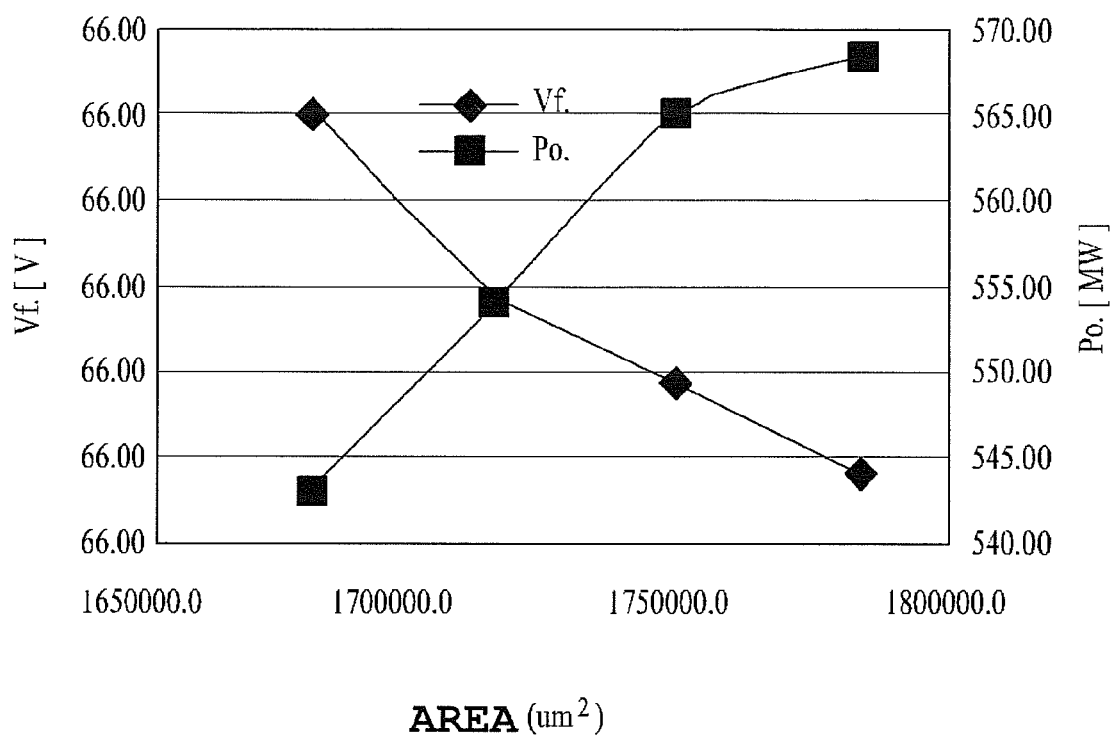
FIG. 7 is a graph showing luminous intensity and operating voltage according to increase in light emitting area.

FIG. 7 is a graph showing luminous intensity Po and operating voltage Vf according to increase in light emitting area. In FIG. 7, a horizontal axis denotes the light emitting area and a vertical axis denotes the luminous intensity Po and the operating voltage Vf.

Changes in the luminous intensity Po and the operating voltage Vf are observed by varying the width (x) and height (y) lengths of each of the first to $M^{th}$ light emitting cells P1 to PM, and results are shown in Table 1 below and FIG. 7.

TABLE 1

| X (μm) | Y (μm) | Unit area (μm²) | Total area (μm²) | Active increase (%) | Vf (Volt) | Po (mW) |
|---|---|---|---|---|---|---|
| 400.0 | 200.0 | 80,000 | 1,680,000 | 100.0 | 66.50 | 543.00 |
| 404.0 | 202.0 | 81,608 | 1,713,768 | 102.0 | 66.29 | 553.91 |
| 408.0 | 204.0 | 83,248 | 1,748,215 | 104.1 | 66.19 | 565.05 |
| 412.1 | 206.1 | 84,922 | 1,783,354 | 106.2 | 66.08 | 568.52 |

In this regard, the unit area denotes an area of a single light emitting cell, the total area denotes an area obtained by summing the areas of the 21 light emitting cells, and the active increase denotes an increase of the light emitting region and is represented by percentage.

Referring to FIG. 2, since the first separation distance is smaller than the second separation distance, the length y in the first direction of each of the first, second, fifth, eighth and ninth light emitting cells P1, P2, P5, P8 and P9 may be greater than the length y in the first direction of each of the third, fourth, sixth and seventh light emitting cells P3, P4, P6 and P7. In this regard, when the width lengths x of the first to ninth light emitting cells P1 to P9 are identical, the area of each of the first, second, fifth, eighth and ninth light emitting cells P1, P2, P5, P8 and P9 is wider than that of each of the third, fourth, sixth and seventh light emitting cells P3, P4, P6 and P7. Thus, as seen from Table 1 above and FIG. 7, it can be confirmed that, as in embodiments, although changes in unit area of each light emitting cell due to the amount by which the first separation distance is smaller than the second separation distance are insignificant, the luminous intensity Po and the operating voltage Vf may be enhanced if the number (M=21) of light emitting cells increases. In addition, current density may be reduced, which results in enhanced reliability. Consequently, in embodiments, since the first separation distance of the first adjacent light emitting cells is smaller than the second separation distance of the second adjacent light emitting cells, the area of the light emitting region may be wider than a light emitting area of the existing light emitting device 10 by a difference between the first and second separation distances. In this regard, as the area of the light emitting region increases, luminous efficacy is enhanced.

In particular, as described above, when the sidewall of the light emitting structure 140 is inclined with respect to the substrate 130, loss of light emitting regions is inevitable. Even in this case, according to the present embodiment, the area of the light emitting regions increases.

Moreover, when a light emitting device is manufactured using the above-described characteristics of embodiments, the area of light emitting regions increases if the number of the first adjacent light emitting cells adjoining each other in the first direction is greater than the number of the second adjacent light emitting cells and thus luminous efficacy may be increased.

Although FIGS. 2 to 5 illustrate each of the first to M$^{th}$ light emitting cells P1 to PM of the light emitting device 100 as having a horizontal structure, embodiments are not limited thereto. That is, the present embodiment may also be applied to a case in which each of the first to M$^{th}$ light emitting cells P1 to PM has a vertical structure or a flip chip structure.

A plurality of light emitting devices according to the embodiment may be disposed on a substrate as a light emitting device package, and an optical member such as a light guide plate, a prism sheet, a diffusion sheet, or the like may be disposed on an optical path of the light emitting device package. The light emitting device package, the substrate, and the optical member may function as a backlight unit.

According to another embodiment, there is provided a display device, an indicating device, or a lighting system including the light emitting device according to the embodiment. For example, the lighting system may include lamps, street lamps, and the like.

Figure 8:
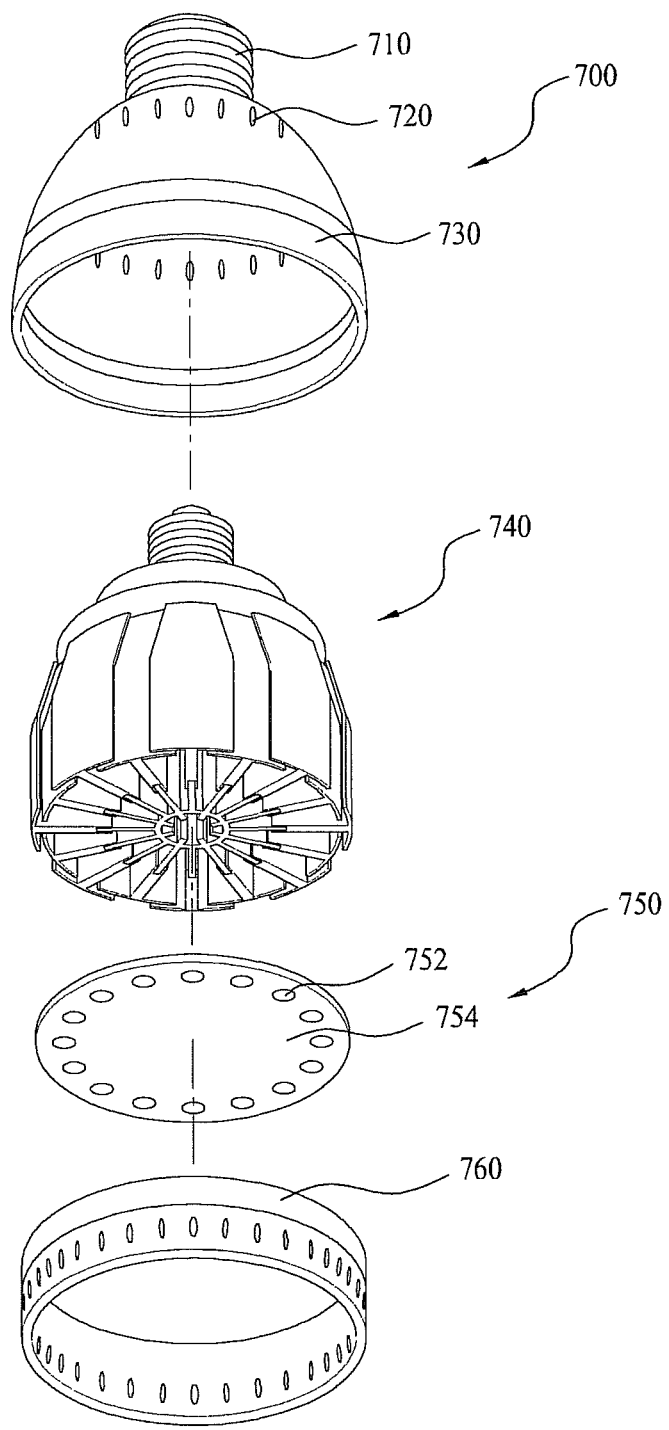
FIG. 8 is an exploded perspective view of a lighting device including the light emitting device according to the embodiment.

FIG. 8 is an exploded perspective view of a lighting device including the light emitting device according to the embodiment. Referring to FIG. 8, the lighting device includes a light source 750 to emit light, a housing 700 for accommodating the light source 750, a heat dissipation unit 740 for dissipating heat generated from the light source 750, and a holder 760 for coupling the light source 750 and the heat dissipation unit 740 to the housing 700.

The housing 700 includes a socket coupling unit 710 coupled to an electrical socket (not shown) and a body unit 730 connected to the socket coupling unit 710 and accommodating the light source 750. The body unit 730 may be provided with a single airflow hole 720 perforated therethrough.

In another embodiment, a plurality of airflow holes 720 may be formed in the body unit 730 of the housing 700. That is, the number of the airflow holes 720 may be at least one. The airflow holes 720 may be disposed in the body unit 730 in a radial form or various other forms.

The light source 750 includes a plurality of light emitting device packages 752 disposed on a substrate 754. The substrate 754 may have a shape allowing insertion into an opening of the housing 700 and be made of a material having a high thermal conductivity to transfer heat to the heat dissipation unit 740 as described below. The light emitting device packages may include the above-described light emitting device.

The light source 750 may be provided at a lower portion thereof with the holder 760, and the holder 760 may include a frame and other airflow holes. In addition, although not shown, the light source 750 may be provided at a lower portion thereof with an optical member to diffuse, scatter or converge light emitted from the light emitting device packages 752 of the light source 750.

Figure 9:
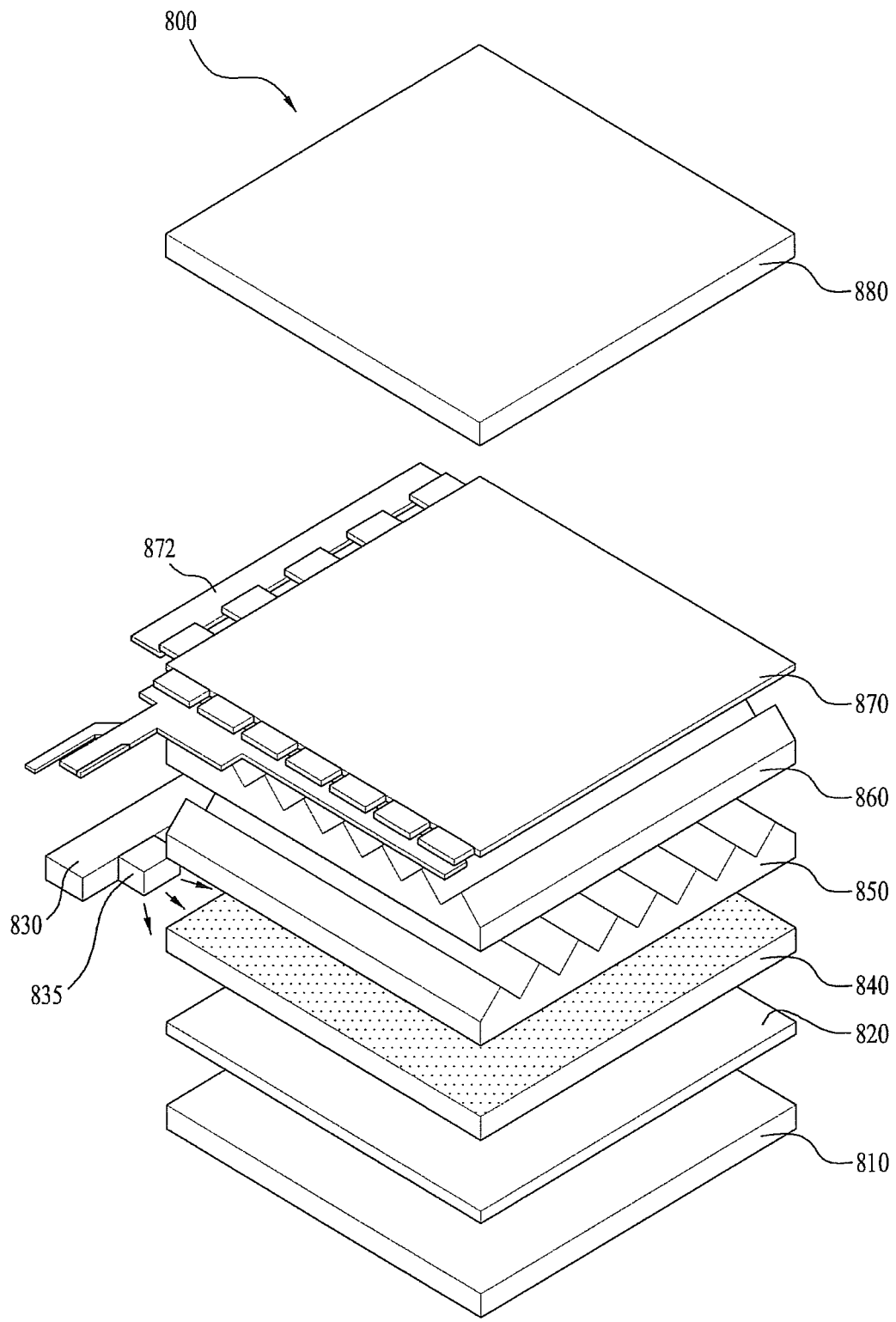
FIG. 9 is a view of a display device including the light emitting device according to the embodiment.

FIG. 9 is a view of a display device 800 including the light emitting device according to the embodiment.

Referring to FIG. 9, the display device 800 may include a bottom cover 810, a reflective plate 820 disposed on the bottom cover 810, a light emitting module (including a substrate 830 and light emitting device packages 835) to emit light, a light guide plate 840 disposed at a front side of the reflective plate 820 and guiding light emitted from the light emitting module towards a front side of the display device 800, an optical sheet including prism sheets 850 and 860 disposed at a front side of the light guide plate 840, a display panel 870 disposed at a front side of the optical sheet, an image signal output circuit 872 connected to the display panel 870 and supplying an image signal to the display panel 870, and a color filter 880 disposed at a front side of the display panel 870. In this regard, the bottom cover 810, the reflective plate 820, the light emitting module, the light guide plate 840, and the optical sheet may constitute a backlight unit.

The light emitting module includes the light emitting device packages 835 on the substrate 830. In this regard, the substrate 830 may be a PCB or the like. The light emitting device packages 835 may include the light emitting device according to the embodiment.

The bottom cover 810 may accommodate elements of the display device 800. The reflective plate 820 may be disposed as a separate element as illustrated in FIG. 9 or may be disposed by coating a material having a high reflectance on a rear surface of the light guide plate 840 or a front surface of the bottom cover 810.

In this regard, the reflective plate 820 may be made of a material having a high reflectance and enabling ultra-thin film fabrication, e.g., polyethylene terephthalate (PET).

The light guide plate 840 may be made of polymethylmethacrylate (PMMA), polycarbonate (PC), polyethylene (PE), or the like.

The first prism sheet 850 may include a support film and a layer of polymer with light transmission and elasticity, and the layer of polymer may include a prism layer in which a plurality of three-dimensional structures is repeated. In this regard, the structure patterns may be formed such that ridges and valleys are repeated in a stripe form as illustrated in FIG. 9.

In the second prism sheet 860, a direction in which ridges and valleys at a surface of a support film extend may be perpendicular to a direction in which the ridges and the valleys at the surface of the support film of the first prism sheet 850 extend. Such a configuration serves to uniformly disperse light transmitted from the light emitting module and the reflective plate 820 towards the entire surface of the display panel 870.

Although not shown, a diffusion sheet may be disposed between the light guide plate 840 and the first prism sheet 850. The diffusion sheet may be formed of a polyester or polycarbonate-based material and maximally increase a light projection angle through refraction and scattering of light incident from the backlight unit. In addition, the diffusion sheet may include a support layer including a light diffusing agent and first and second layers formed on a light emitting surface (in the direction of the first prism sheet 850) and a light incident surface (in the direction of the reflective plate 820) and excluding a light diffusing agent.

In the present embodiment, the diffusion sheet, the first prism sheet 850, and the second prism sheet 860 constitute an optical sheet. In another embodiment, the optical sheet may include other combinations, e.g., a micro lens array, a combination of a diffusion sheet and a micro lens array, a combination of a single prism sheet and a micro lens array, or the like.

The display panel 870 may include a liquid crystal display. In addition, the display panel 870 may include other types of display devices requiring a light source.

As is apparent from the above description, a light emitting device according to an embodiment has wider light emitting regions than an existing light emitting device and thus luminous intensity and operating voltage may be enhanced, and current density may be reduced, which results in enhanced reliability.

Embodiments provide a light emitting device with enhanced luminous efficacy by increasing an area of a light emitting region.

In one embodiment, a light emitting device includes a substrate, a plurality of light emitting cells disposed on the substrate to be spaced apart from each other, and a connection wire electrically connecting adjacent ones of the light emitting cells, wherein a first separation distance between first adjacent light emitting cells adjacent to each other without being connected by the connection wire among the light emitting cells is smaller than a second separation distance between second adjacent light emitting cells adjacent to each other with being connected by the connection wire among the light emitting cells.

The first separation distance by which the first adjacent light emitting cells are spaced apart from each other in a first direction may be smaller than a 2-1 separation distance by which the second adjacent light emitting cells are spaced apart from each other in the first direction.

The first separation distance by which the first adjacent light emitting cells are spaced apart from each other in a first direction may be smaller than a 2-2 separation distance by which the second adjacent light emitting cells are spaced apart from each other in a second direction that is different from the first direction.

The first separation distance by which the first adjacent light emitting cells are spaced apart from each other in a first direction may be smaller than a 2-1 separation distance by which the second adjacent light emitting cells are spaced apart from each other in the first direction, and the first separation distance may be smaller than a 2-2 separation distance by which the second adjacent light emitting cells are spaced apart from each other in a second direction that is different from the first direction.

The 2-1 separation distance and the 2-2 separation distance may be the same or different.

The first separation distance may be the same as the 2-1 separation distance.

The first separation distance may be the same as the 2-2 separation distance.

The first separation distance may be 0.2 times or greater the second separation distance and less than the second separation distance, the first direction may be a vertical direction, and the second direction may be a horizontal direction.

The number of the first adjacent light emitting cells may be greater than the number of the second adjacent light emitting cells.

Each of the light emitting cells may include a light emitting structure including a first conductive type semiconductor layer, an active layer, and a second conductive type semiconductor layer that are sequentially disposed on the substrate, a first electrode disposed on the first conductive type semiconductor layer, and a second electrode disposed on the second conductive type semiconductor layer.

A side surface of the light emitting structure may be inclined with respect to the substrate.

The first separation distance may correspond to a separation distance between the first conductive type semiconductor layers of the first adjacent light emitting cells, and the second separation distance may correspond to a separation distance between the first conductive type semiconductor layers of the second adjacent light emitting cells.

The first separation distance may correspond to a separation distance between the second conductive type semiconductor layers of the first adjacent light emitting cells, and the second separation distance may correspond to a separation distance between the second conductive type semiconductor layers of the second adjacent light emitting cells.

Each of the light emitting cells may further include a conductive layer disposed between the second conductive type semiconductor layer and the second electrode, the first separation distance may correspond to a separation distance between the conductive layers of the first adjacent light emitting cells, and the second separation distance may correspond to a separation distance between the conductive layers of the second adjacent light emitting cells.

The first separation distance may be between 4 µm and 20 µm, and the second separation distance may be greater than 20 µm, the first separation distance may be between 10 µm and 25 µm, and the second separation distance may be greater than 25 µm.

The light emitting device may further include an insulating layer disposed between the connection wire and the second adjacent light emitting cells and electrically separating the connection wire from the second adjacent light emitting cells.

At least one of the first electrode or the second electrode of some of the light emitting cells may be integrated with the connection wire.

Any reference in this specification to "one embodiment," "an embodiment," "example embodiment," etc., means that a particular feature, structure, or characteristic described in connection with the embodiment is included in at least one embodiment of the application. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
a substrate;
a plurality of light emitting cells arranged on the substrate to be spaced apart from each other; and
connection wires configured to electrically connect adjacent light emitting cells, wherein the plurality of light emitting cells includes at least first, second, third, and fourth light emitting cells, wherein the first and second light emitting cells are connected by a first connection wire among the connection wires, the first and fourth light emitting cells are connected by a second connection wire among the connection wires, the third and fourth light emitting cells are connected by a third connection wire among the connection wires, and the second and third light emitting cells are not connected by any connection wire among the connection wires, wherein each lighting emitting cell includes a first conductive type semiconductor layer having a rectangular shape on a first plane, wherein a first length in a first direction of each first conductive type semiconductor layer of the first and fourth light emitting cells adjacent to each other in the first direction is shorter than a second length in the first direction of each first conductive type semiconductor layer of the second and third light emitting cells adjacent to each other in the first direction, and wherein each lighting emitting cell includes a first electrode having a bar shape and a second electrode having an L shape, and the first and second electrodes are separately arranged in a diagonal direction.

2. The light emitting device according to claim 1, wherein the first light emitting cell is adjacent to a first side of the second light emitting cell,
wherein the third light emitting cell is adjacent to a second side of the second light emitting cell,
wherein a first side of the first light emitting cell is adjacent to a first side of the second light emitting cell,
wherein a second side of the first light emitting cell is adjacent to the first side of the fourth light emitting cell,
wherein the second side of the second light emitting cell is adjacent to a first side of the third light emitting cell,
wherein a second side of the third light emitting cell is adjacent to a second side of the fourth light emitting cell; and
wherein a first distance between the second side of the first light emitting cell and the first side of the fourth light emitting cell is greater than a second distance between the second side of the second light emitting cell and the first side of the third light emitting cell.

3. The light emitting device according to claim 2, wherein a third distance between the first side of the first light emitting cell and the first side of the second light emitting cell is greater than the second distance.

4. The light emitting device according to claim 2, wherein the second distance is more than 0.2 times of a third distance between the first side of the first light emitting cell and the first side of the second light emitting cell and less than the third distance.

5. The light emitting device according to claim 1, further comprising an insulating layer provided under the connection wires.

6. The light emitting device according to claim 1, wherein each of the light emitting cells includes:
a light emitting structure including:
a first conductive type semiconductor layer, an active layer, and a second conductive type semiconductor layer that are sequentially arranged on the substrate;
the first electrode provided on the first conductive type semiconductor layer; and
the second electrode provided on the second conductive type semiconductor layer.

7. The light emitting device according to claim 6, wherein a side surface of the light emitting structure is inclined with respect to the substrate.

8. The light emitting device according to claim 6, wherein the first separation distance corresponds to a separation distance between the first conductive type semiconductor layers of the first adjacent light emitting cells, and the second separation distance corresponds to a separation distance between the first conductive type semiconductor layers of the second adjacent light emitting cells.

9. The light emitting device according to claim 8, wherein the first separation distance is between 4 μm and 20 μm, and the second separation distance is greater than 20 μm.

10. The light emitting device according to claim 6, wherein the first separation distance corresponds to a separation distance between the second conductive type semiconductor layers of the first adjacent light emitting cells, and the second separation distance corresponds to a separation distance between the second conductive type semiconductor layers of the second adjacent light emitting cells.

11. The light emitting device according to claim 6, wherein each of the light emitting cells including the first, second, third, and fourth light emitting cells further comprises a conductive layer disposed between the second conductive type semiconductor layer and the second electrode, a first distance corresponds to a separation distance between the conductive layers of the first and fourth light emitting cells, and a second distance corresponds to a separation distance between the conductive layers of the second and third light emitting cells.

12. The light emitting device according to claim 6, wherein at least one of the first electrode or the second electrode of the adjacent light emitting cells connected by the connection wires, among the first, second, third and fourth light emitting cells is integrated with the connection wires.

13. The light emitting device according to claim 6, wherein a first side surface of the first conductive type semiconductor layer is inclined at a first angle with respect to the substrate, wherein a second side surface of the first conductive type semiconductor layer adjacent to an exposed upper portion thereof is inclined at a second angle, and wherein the first angle and the second angle are between 30 degrees and 80 degrees.

14. The light emitting device according to claim 1, wherein widths in a second direction of the first, second, third, and fourth light emitting cells are identical, the second direction being different from the first direction, and
wherein a planar area of each of the second and third light emitting cells is wider than a planar area of each of the first and fourth light emitting cells.

15. A light emitting device, comprising:
a substrate;
a plurality of light emitting cells arranged on the substrate to be spaced apart from each other, the plurality of light emitting cells including at least first, second, third and fourth light emitting cells, the first light emitting cell provided adjacent to a first side of the second light emitting cell, and the third light emitting cell provided adjacent to a second side of the second light emitting cell, and a first side of the first light emitting cell provided adjacent to the first side of the second light emitting cell, and a second side of the first light emitting cell provided adjacent to a first side of the fourth light emitting cell, and the second side of the second light emitting cell provided adjacent to a first side of the third light emitting cell, and a second side of the third light emitting cell provided adjacent to a second side of the fourth light emitting cell; and
connection wires configured to electrically connect adjacent light emitting cells, wherein the first and second light emitting cells are connected by a first connection wire among the connection wires, the first and fourth light emitting cells are connected by a second connection wire among the connection wires, the third and fourth light emitting cells are connected by a third connection wire among the connection wires, and the second and third light emitting cells are not directly connected by any connection wire among the connection wires, wherein a first distance between the second side of the first light emitting cell and the first side of the fourth light emitting cell is greater than a second distance between the second side of the second light emitting cell and the first side of the third light emitting cell, wherein a third distance between the first side of the first light emitting cell and the first side of the second light emitting cell is greater than the second distance, and wherein a first length in a first direction of each of the first and fourth light emitting cells adjacent to each other in the first direction is shorter than a second length in the first direction of each of the second and third light emitting cells adjacent to each other in the first direction.

16. The light emitting device according to claim 15, wherein a 2-1 separation distance and a 2-2 separation distance are identical.

17. The light emitting device according to claim 15, wherein the first distance and the third distance differ from each other.

18. The light emitting device according to claim 17, wherein the first separation distance is the same as a 2-1 separation distance.

19. The light emitting device according to claim 18, wherein the first separation distance is the same as a 2-2 separation distance.

20. The light emitting device according to claim 15, wherein the first direction from the first light emitting cell to the fourth light emitting cell is a vertical direction and a second direction from the first light emitting cell to the second light emitting cell is a horizontal direction.

* * * * *